(12) United States Patent
Cho et al.

(10) Patent No.: US 7,315,055 B2
(45) Date of Patent: Jan. 1, 2008

(54) SILICON-OXIDE-NITRIDE-OXIDE-SILICON (SONOS) MEMORY DEVICES HAVING RECESSED CHANNELS

(75) Inventors: Myoung-kwan Cho, Gyeonggi-do (KR); Sung-hoi Hur, Seoul (KR); Eun-suk Cho, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 51 days.

(21) Appl. No.: 10/999,306

(22) Filed: Nov. 30, 2004

(65) Prior Publication Data

US 2005/0253189 A1    Nov. 17, 2005

(30) Foreign Application Priority Data

May 11, 2004    (KR)    .................... 10-2004-0033072

(51) Int. Cl.
    *H01L 29/76*    (2006.01)
(52) U.S. Cl. .................... 257/314; 365/185.03
(58) Field of Classification Search ................ 257/314; 365/185.03
    See application file for complete search history.

(56) References Cited

U.S. PATENT DOCUMENTS

| 5,768,192 A | 6/1998 | Eitan |
| 2003/0235076 A1* | 12/2003 | Forbes ................ 365/185.03 |
| 2004/0130934 A1* | 7/2004 | Prall et al. ................ 365/154 |

FOREIGN PATENT DOCUMENTS

| JP | 2003-318290 | 10/2003 |
| KR | 2003-0019585 | 3/2003 |

* cited by examiner

*Primary Examiner*—Carl Whitehead, Jr.
*Assistant Examiner*—Candice Y Chan
(74) *Attorney, Agent, or Firm*—Myers Bigel Sibley & Sajovec PA

(57) ABSTRACT

Unit cells of silicon-oxide-nitride-oxide-silicon (SONOS) memory devices are provided. The unit cells include an integrated circuit substrate and a SONOS memory cell on the integrated circuit substrate. The SONOS memory cell includes a source region, a drain region and a gate contact. The integrated circuit substrate defines a trench between the source and drain regions and the gate contact is provided in the trench. A floor of the trench extends further into the integrated circuit substrate than lower surfaces of the source and drain regions. Related methods of fabricating SONOS memory cells are also provided.

9 Claims, 5 Drawing Sheets

SILICON-OXIDE-NITRIDE-OXIDE-SILICON (SONOS) MEMORY DEVICES HAVING RECESSED CHANNELS

CLAIM OF PRIORITY

This application is related to and claims priority from Korean Patent Application No. 2004-33072, filed on May 11, 2004, the disclosure of which is hereby incorporated herein by reference as if set forth in its entirety.

FIELD OF THE INVENTION

The present invention relates to integrated circuit devices and methods of fabricating the same and, more particularly, to silicon-oxide-nitride-oxide-silicon (SONOS) memory devices and methods of fabricating the same.

BACKGROUND OF THE INVENTION

Recently, the use of silicon-oxide-nitride-oxide-silicon (SONOS) memory devices has increased. SONOS memory devices typically have a charge trapping layer between the dielectric films instead of a floating gate like conventional stack gate memory devices. The SONOS memory devices may also include metal-oxide-nitride-oxide-silicon (MONOS) devices.

Programmable read only memory (PROM) devices having charge trapping layers are discussed, for example, in U.S. Pat. No. 5,768,192 to Boaz Eitan, entitled NON-VOLATILE SEMICONDUCTOR MEMORY CELL UTILIZING ASYMMETRICAL CHARGE TRAPPING. As discussed therein, 2 bits of data may be stored in each memory cell. FIG. 1 is a cross section illustrating a SONOS memory cell capable of storing 2 bits of data per memory cell as discussed in U.S. Pat. No. 5,768,192.

As illustrated in FIG. 1, the 2-bit SONOS memory cell includes an integrated circuit substrate 110, source and drain regions 112 and 114, respectively, a first dielectric layer 120, a charge trapping layer 130, a second dielectric layer 140 and a gate contact 180. The first dielectric layer 120 is provided on the substrate 110, the charge trapping layer 130 is provided on the first dielectric layer 120, the second dielectric layer 140 is provided on the charge trapping layer 130 and the gate contact 180 is provided on the second dielectric layer 140. The charge trapping layer 130 typically includes silicon nitride, which has excellent charge trapping characteristics. Charges may be stored at charge trapping sites 132, which are located at both ends of the charge trapping layer 130. Although silicon nitride has excellent charge trapping characteristics, it cannot typically completely prevent migration of the trapped charges between the charge trapping sites 132. If migration of charges occurs, threshold voltages of the device may vary, which may decrease the reliability of the device.

As semiconductor devices become more integrated, the likelihood of the occurrence of the short channel effects may increase. In these devices, a width of the charge trapping layer 130 may also decrease, decreasing the gap between the charge trapping sites 132. A narrow gap between the charge trapping sites 132, may increase the likelihood of migration. Even a slight migration of the trapped charges can deteriorate the reliability of the deviceso that it may be difficult to store 2 data bits in a single memory cell.

Devices having a pair of trapping patterns 230a, as illustrated in FIG. 2, have been developed to address issues caused by the decreasing size of semiconductor devices. As illustrated in FIG. 2, the memory cell includes an integrated circuit substrate 210, a source region 212, a drain region 214, a first dielectric layer 220, a pair of charge trapping patterns 230a, a pair of dielectric patterns 240a and a gate contact 280. The first dielectric layer 220 has a width similar to a width of the gate contact 280. The pair of charge trapping patterns 230a are separated from each other in order to reduce the likelihood if the migration of the trapped charges. Although the structure of FIG. 2 may address problems of migration, it may not address the problems experiences as a result of the short channel effect.

SUMMARY OF THE INVENTION

Some embodiments of the present invention provide unit cells of silicon-oxide-nitride-oxide-silicon (SONOS) memory devices. The unit cells include an integrated circuit substrate and a SONOS memory cell on the integrated circuit substrate. The SONOS memory cell includes a source region, a drain region and a gate contact. The integrated circuit substrate defines a trench between the source and drain regions and the gate contact is provided in the trench. A floor of the trench extends further into the integrated circuit substrate than lower surfaces of the source and drain regions.

In further embodiments of the present invention, a first charge trapping pattern may be provided on the integrated circuit substrate between a first sidewall of the trench and the source region. A second charge trapping pattern may be provided on the integrated circuit substrate between a second sidewall of the trench and the drain region. A first dielectric pattern may be provided on the integrated circuit substrate between the integrated circuit substrate and the first charge trapping pattern. A second dielectric pattern may be provided on the first charge trapping pattern. A third dielectric pattern may be provided on the integrated circuit substrate between the integrated circuit substrate and the second charge trapping pattern. A fourth dielectric pattern may be provided on the second charge trapping pattern. The first and third dielectric patterns may have thicknesses of from about 25 to about 35 Å and the second and fourth dielectric patterns may have thicknesses of from about 30 to about 50 Å. The first through fourth dielectric patterns and the first or second charge trapping patterns may have similar widths.

In still further embodiments of the present invention, a gate oxide film may be provided on the first and second sidewalls and the floor of the trench between the integrated circuit substrate and the gate contact. The gate oxide film may further extend onto sidewalls of the first through fourth dielectric patterns and the first and second charge trapping patterns. The gate oxide film may have a thickness of from about 50 to about 80 Å. In certain embodiments of the present invention, the trench may extend at least about 2000 Å into the integrated circuit substrate.

While the present invention is described above primarily with reference to SONOS memory cells, methods of fabricating SONOS memory cells are also provided herein.

DETAILED DESCRIPTION OF EMBODIMENTS OF THE PRESENT INVENTION

Figure 1:
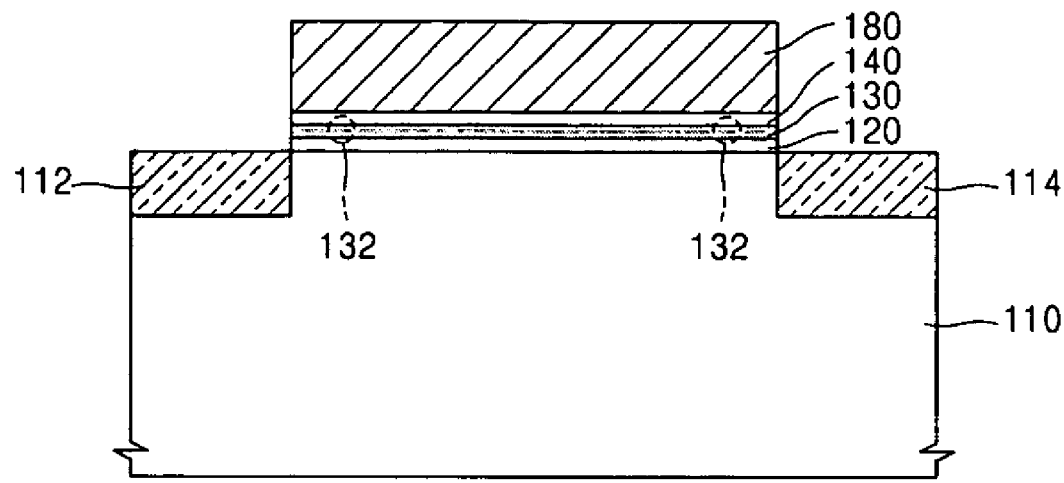
FIG. 1 is a cross section illustrating conventional 2-bit silicon-oxide-nitride-oxide-silicon (SONOS) memory cells.
Figure 2:
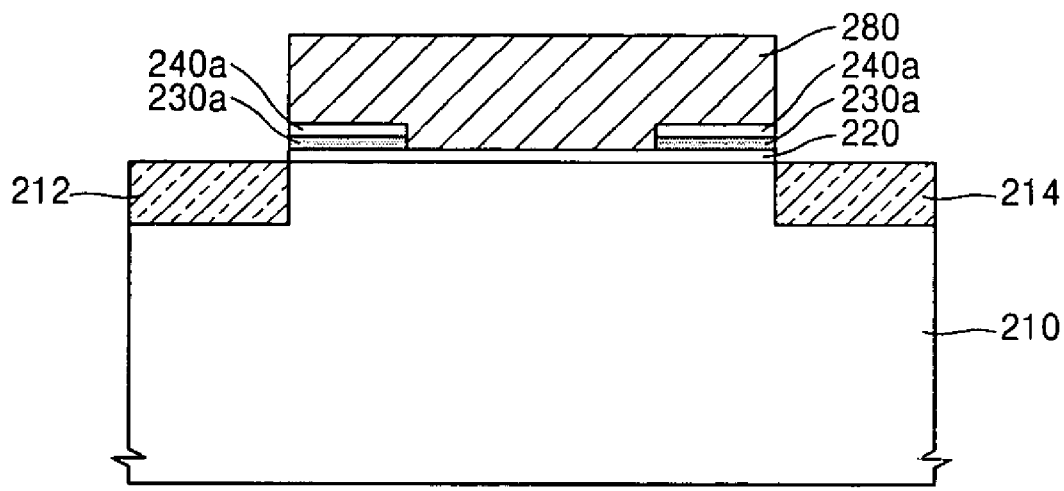
FIG. 2 is a cross section illustrating further conventional 2-bit SONOS memory cells.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3A:
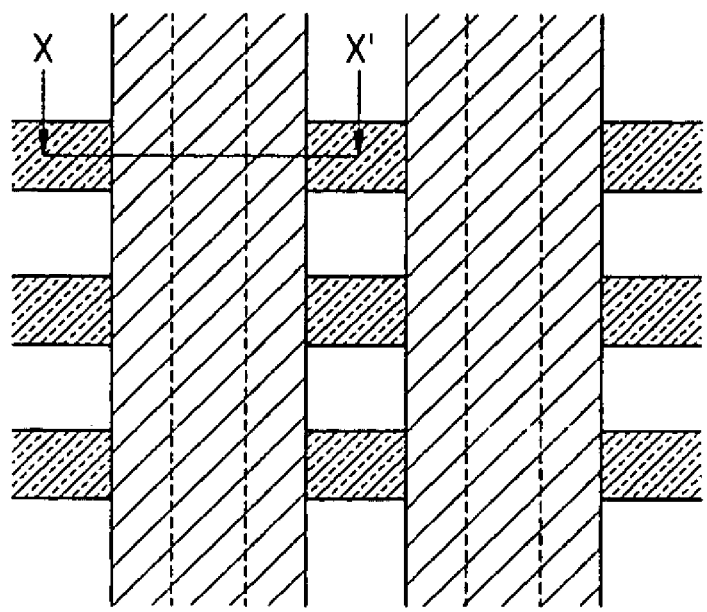
FIG. 3A is a plan view illustrating 2-bit SONOS memory cell arrays according some embodiments of the present invention.
Figure 3B:
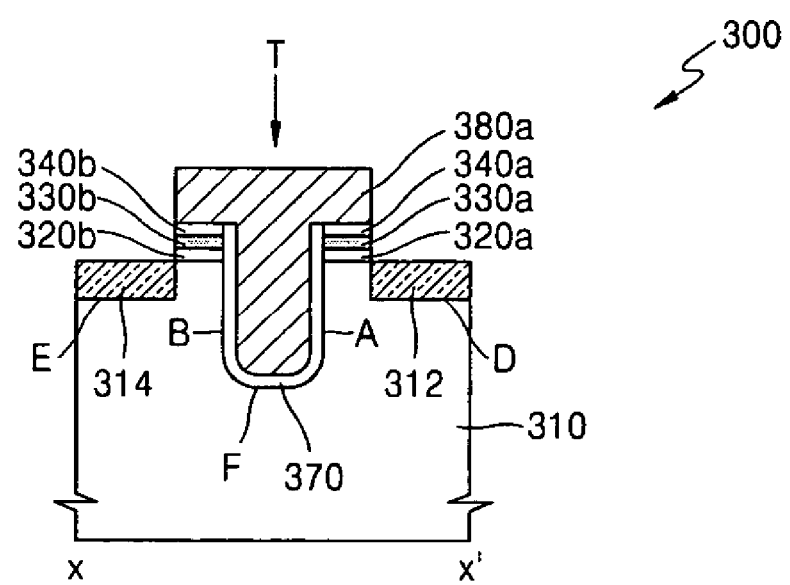
FIG. 3B is a cross section taken along line X-X' of FIG. 3A.

FIG. 3A is a plan view of 2-bit silicon-oxide-nitride-oxide-silicon (SONOS) memory device according to some embodiments of the present invention. FIG. 3B is a cross section taken along line X-X' of FIG. 3A. As illustrated in FIGS. 3A and 3B, a unit cell of a 2-bit SONOS memory device 300 includes an integrated circuit substrate 310. The integrated circuit substrate 310 may be, for example, a silicon substrate. A source region 312 and a drain region 314 are provided on the integrated circuit substrate 310. In some embodiments of the present invention, the integrated circuit substrate 310 is a p-type conductivity integrated circuit substrate. In these embodiments of the present invention, the source and drain regions 312 and 314 may be provided by doping 5B group elements, such as Arsenide (As) or Phosphorus (P). Furthermore, the source and drain regions 312 and 314 may be a single impurity region and may or may not have a lightly doped drain (LLD) structure. A trench T is provided between the source and drain regions 312 and 314, such that the source region 312 is a predetermined distance from a first sidewall A of the trench T and the drain region 314 is a predetermined distance from a second sidewall B of the trench. Furthermore, the trench T has a trench floor F that extends further into the substrate 310 than respective lower surfaces D and E of the source and drain regions 312 and 314. For example, in some embodiments of the present invention the trench T extends at least about 2,000 Å into the substrate 310.

As further illustrated, the 2-bit SONOS unit cell 300 includes first and second dielectric patterns 320a and 320b on the substrate 310, first and second charge trapping patterns 330a and 330b on the first and second dielectric patterns 320a and 320b, respectively, and third and fourth dielectric patterns 340a and 340b on the first and second charge trapping patterns 330a and 330b, respectively. The first dielectric pattern 320a, the first charge trapping pattern 330a and the third dielectric pattern 340a are provided between the first sidewall A of the trench and the source region 312. Similarly, the second dielectric pattern 320b, the second charge trapping pattern 330b and the fourth dielectric pattern 340b are provided between a second sidewall B of the trench and the drain region 314. In some embodiments of the present invention, the first and second dielectric patterns 320a and 320b may include silicon nitride and have a thickness of, for example, from about 25 to about 35 Å. The first and second dielectric patterns 320a and 320b may provide a tunnel oxide film. The first and second charge trapping patterns 330a and 330b may include silicon nitride, which typically has excellent charge trapping characteristics. The first and second charge trapping patterns 330a and 330b may have a thickness of, for example, from about 30 to about 50 Å. The first and second charge trapping patterns 330a and 330b may provide a storage region for charges passing through the tunnel oxide films (first and second dielectric patterns 320b). The third and fourth dielectric patterns 340a and 340b may include silicon oxide and may reduce the likelihood that the trapped charges will move into external regions, such as the gate 380a. In some embodiments of the present invention, the third and fourth dielectric patterns 340a and 340b may be thicker than the first and second dielectric patterns 320a and 320b. For example, the third and fourth dielectric patterns 340a and 340b may have a thickness of from about 30 to about 50 Å.

The unit cell 300 further includes a gate oxide film 370 on the first A and second B sidewalls and the floor F of the trench T. In some embodiments of the present invention, the gate oxide film 370 may extend on the first and second dielectric patterns 320a and 320b, the first and second charge trapping patterns 330a and 330b, and third and fourth dielectric patterns 340a and 340b. The gate oxide film 370 may be, for example, a thermal oxidation film, and may have a thickness of from about 50 to about 80 Å.

The unit cell 300 further includes a gate contact 380a. The gate contact 380a, which includes a conductive material, may be, for example, a single film including a doped polysilicon, a composite film of polysilicon film and a metal silicide film, or a metal film without departing from the teachings of the present invention. The gate contact 380a is provided on the gate oxide film 370 and on a surface of the third and fourth dielectric patterns 340a and 340b. The gate contact 380a extends in a vertical direction as illustrated in FIG. 3A such that the gate contacts of adjacent 2-bit SONOS unit cells are electrically coupled.

According to some embodiments of the present invention, the 2-bit SONOS unit cell 300 includes first and second charge trapping patterns 330a and b, separated from each other by the trench T and the gate oxide film 370. Furthermore, the first and second dielectric patterns 320a and 320b are also separated by the trench T and the gate oxide film 370. Thus, it may be possible to reduce the likelihood of migration of the trapped charges from one charge trapping site to another. Furthermore, memory cells 300 according to some embodiments of the present invention have a recessed channel structure, thus, possibly reducing the effects of the short channel effect.

Figure 4A:
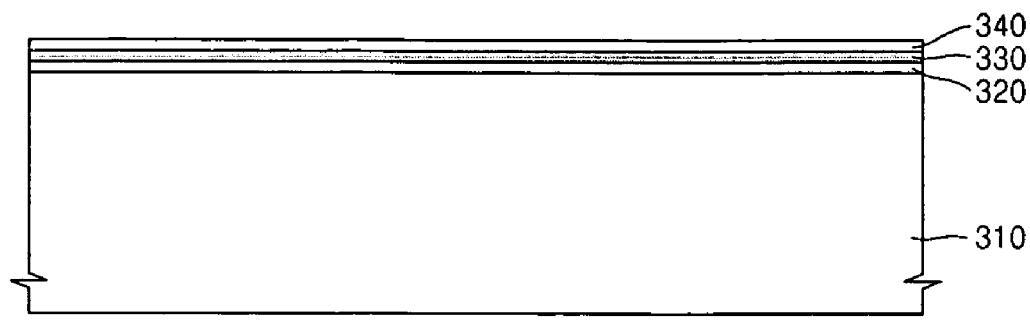
FIGS. 4A through 4G are cross sections illustrating processing steps in the fabrication of 2-bit SONOS memory cells according some embodiments of the present invention.

Referring now to FIGS. 4A through 4E, cross sections illustrating processing steps in the fabrication of memory devices according to some embodiments of the present invention will be discussed. As illustrated in FIG. 4A, a first dielectric layer 320 is formed on the substrate 310, a charge trapping layer 330 is formed on the first dielectric layer 320, and a second dielectric layer 340 is formed on the charge trapping layer 330. The integrated circuit substrate 310 may be, for example, a p-type conductivity silicon substrate. The first dielectric layer 320 may include silicon oxide and have a thickness of from about 25 to about 35 Å. A portion of the first dielectric layer 320 provides a tunnel oxide film. The charge trapping layer 330 may include a non-conductive material having excellent charge trapping characteristics, for example, silicon nitride. The charge trapping layer 330 may have a thickness of from about 30 to about 50 Å. A portion of the charge trapping layer 330 may provide a charge trapping pattern of the memory cell. Furthermore, the second dielectric layer 340 may include, for example, silicon oxide and have a thickness of from about 30 to about 50 Å. A portion of the second dielectric layer 340 provides a barrier oxide film of the memory cell. The first dielectric layer 320, the charge trapping layer 330, and the second dielectric layer 340 may be grown or deposited using methods known to those having skill in the art and, therefore, the details with respect to the formation of these layers will not be discussed further herein.

Figure 4B:
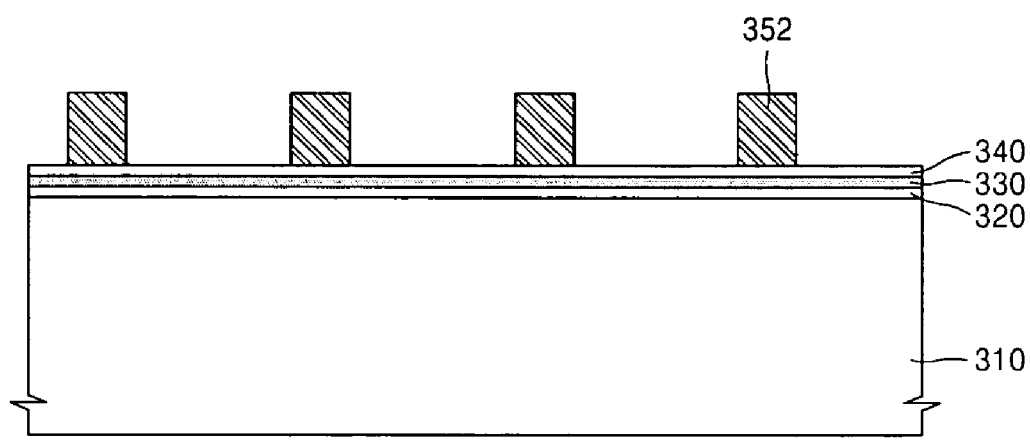
Figure 4C:
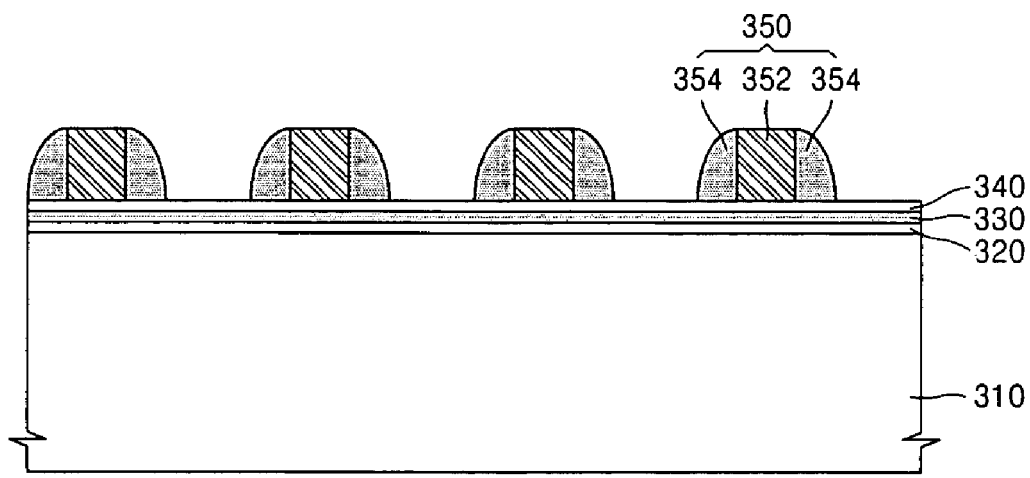

As illustrated in FIGS. 4B and 4C, a material film pattern 350 is formed on the on the second dielectric layer 340 to provide a mask to form a trench region as discussed below. Referring to FIG. 4B, a first material film pattern 352 is formed on the second dielectric layer 340. The first material film pattern 352 may include a material having a higher etching selectivity than the first dielectric layer 320, the charge trapping layer 330, and the second dielectric layer 340. In particular, a polysilicon film having a predetermined thickness is formed on the surface of the second dielectric layer 340 and, then the polysilicon film is patterned using, for example, a photolithography process.

Referring now to FIG. 4C, a second material film pattern 354 is formed on both sides of the first material film pattern 352. The second material film pattern 354 may formed using a sidewall spacer forming process. In particular, a material film, for example, a silicon nitride film, is formed on the surface of the second dielectric layer 340 including the first material film pattern 352. An etchback process is performed to provide the sidewall spacers 354. As a result, the material film pattern 350 including the first material film pattern 352 and the second material film pattern 354 are formed on the second dielectric layer 340.

Figure 4D:
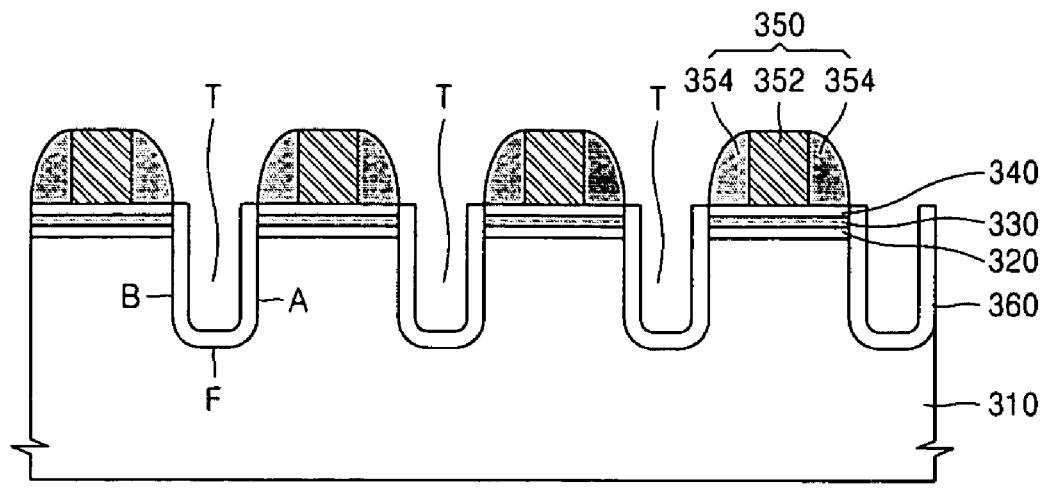

As illustrated in FIG. 4D, using the second material film pattern 354 as a mask, the second dielectric layer 340, the charge trapping layer 330, and the first dielectric layer 320 are etched through into the integrated circuit substrate 310 to define a trench T. The trench T has first A and second B sidewalls and a floor F. The floor F of the trench T extends at least about 2,000 Å into the substrate 110a.

Figure 4E:
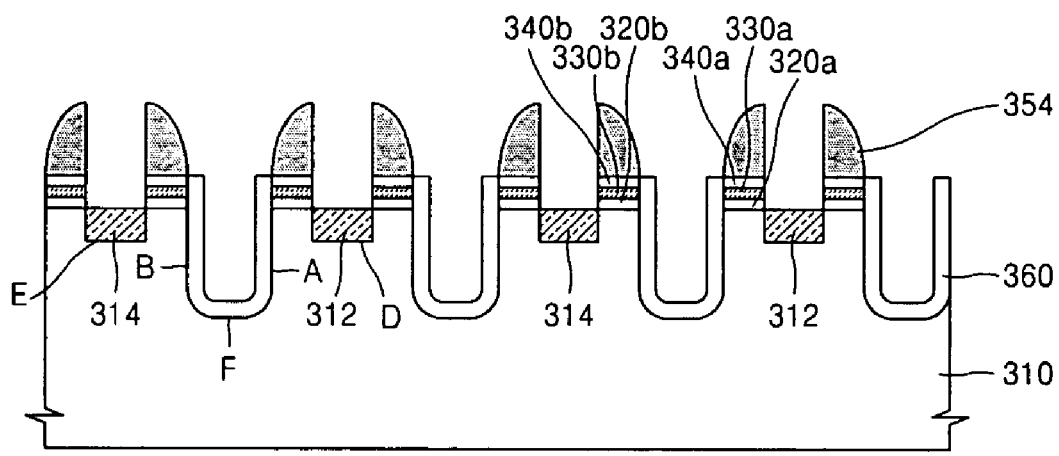

A barrier layer 360 is provided on the first A and second B sidewalls and the floor F of the trench T. The barrier layer 360 may prevent ions from being implanted into the integrated circuit substrate 310 exposed by the trench T during a subsequent ion implantation process for forming the source drain regions (FIG. 4E). Thus, the barrier layer 360 has a thickness capable of preventing ion implantation. The barrier layer 360 may be formed by, for example, performing a thermal oxidation process. In these embodiments, the barrier layer 360 may be a thermal oxide film. The barrier layer 360 may also be formed on portions of the first dielectric pattern 320, the charge trapping pattern 330, and the second dielectric pattern 340, which are exposed by the trench T.

Referring to FIG. 4E, the first material film pattern 352 is removed between the sidewall spacers of the second material film pattern 354. The first material film pattern 352 may be selectively removed using, for example, a selective etching method with a high etching selectivity. For example, the first material film pattern 352 may be selectively removed using an etchant having a higher etching ratio of polysilicon than silicon oxide or silicon nitride.

Subsequently, an anisotropic etching process is performed on the second dielectric pattern 340, the charge trapping pattern 330, and the first dielectric pattern 320 using the second material film pattern 354 as a mask to expose the integrated circuit substrate 310. As a result, the third and fourth dielectric patterns 340a and 340b, first and second charge trapping patterns 330a and 330b, and the first and second dielectric patterns 320a and 320b remain on the integrated circuit substrate 310.

An ion implantation process is performed to form the source and drain regions 312 and 314 on the exposed portion of the integrated circuit substrate 310. In some embodiments of the present invention, the integrated circuit substrate may be a p-type conductivity integrated circuit substrate, including, for example, As or P. Thus, As or P ions may be implanted. The implanted ions may be annealed to activated the implant. As discussed above, the barrier layer 360 prevents ions from being implanted into the integrated circuit substrate 310 exposed by the trench T during implantation of the source and drain regions 312 and 314. The trench T extends further into the substrate 310 than respective lower surfaces D and E of the source and drain regions D and E.

Figure 4F:
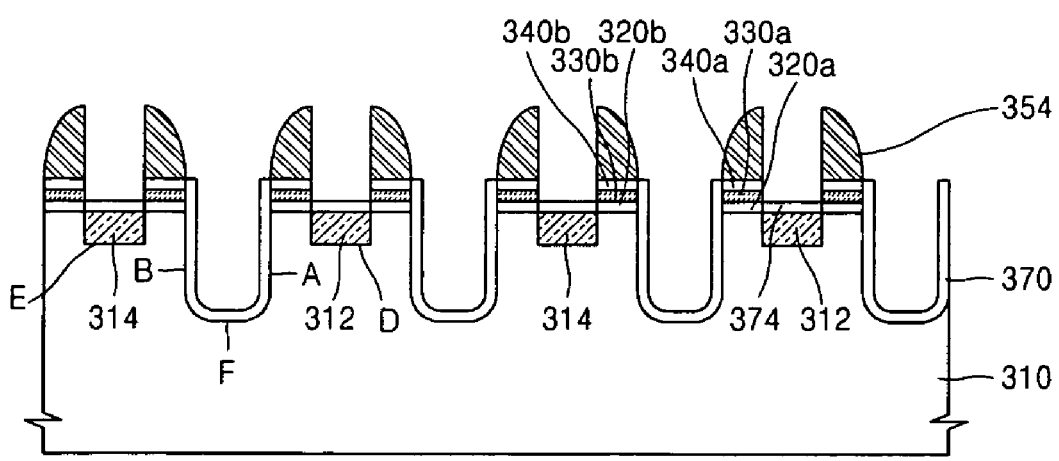

Referring now to FIG. 4F, the barrier layer 360 is removed. A gate oxide film 370 is formed on the integrated circuit substrate 310 on the first and second sidewalls and the floor F of the trench T. The gate oxide film 370 can be formed using, for example, a thermal treatment process. The gate oxide film 370 may have a thickness of from about 50 to about 80 Å. In embodiments of the present invention using the thermal treatment process, a silicon oxide film 374 may be formed on the integrated circuit substrate 310 on the source and drain regions 312 and 314.

Figure 4G:
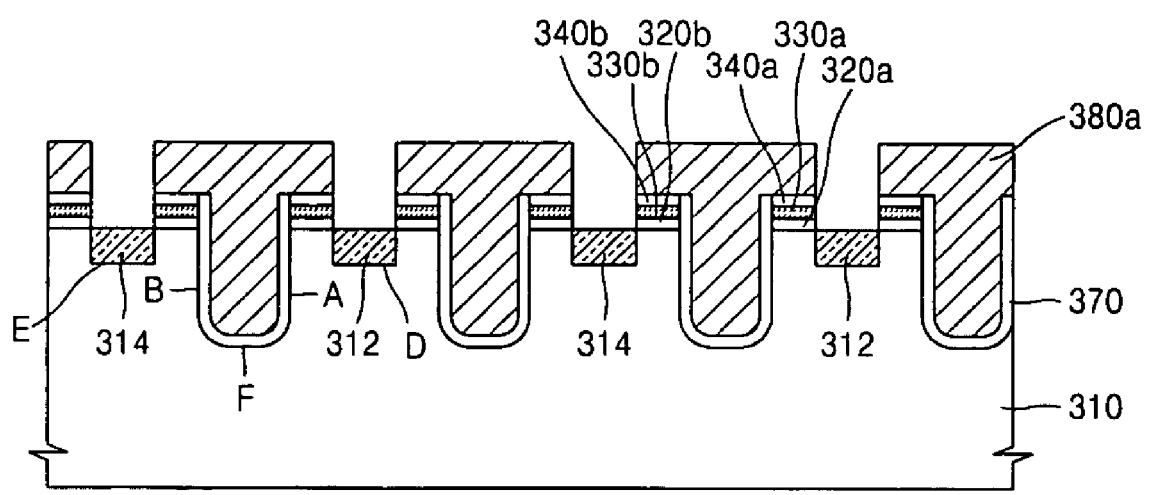

Referring to FIG. 4G, the second material film pattern 354 is selectively removed, exposing surfaces of the third and fourth dielectric patterns 340a and 340b. A conductive material layer is deposited on the surface of the resultant device to form a gate contact 380a. A conductive material layer is provided in the trench T on the gate oxide film 370. In addition, the conductive material is deposited such that is provided on a surface of the third and fourth second dielectric patterns 340a and 340b. The conductive material layer may be, for example, a single film of an impurity-doped polysilicon, or a composite film of a polysilicon film and a metal silicide film. The conductive material layer may be patterned, for example, using a photolithography process to form the contact gate 380a. As shown in FIG. 3A, the gate 380a extends in a vertical direction and exposes at least the source and drain regions 312 and 314.

Subsequently, an interlayer insulating film, a contact hole, and a metal wiring are formed on the surface of the device using methods known to those having skill in the art and, therefore, will not be discussed in detail herein.

As briefly discussed above with respect to FIGS. 3A through 4G, a 2-bit SONOS memory cell is provided having first and second charge trapping patterns separated from each other, which may reduce the likelihood that the performance of the device will be effected due to migration of trapped charges. Furthermore, some embodiments of the present invention also provide a gate contact in a recessed channel, which may solve problems related to the short channel effect.

Furthermore, a first dielectric pattern may be separated from a gate oxide film. Thus, the first dielectric pattern and the gate oxide film may be formed separately having distinct characteristics. Therefore, the 2-bit SONOS memory cell according to embodiments of the present invention may have excellent electrical characteristics.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A unit cell of a silicon-oxide-nitride-oxide-silicon (SONOS) memory device comprising:
    an integrated circuit substrate;
    a SONOS memory cell on the integrated circuit substrate, the SONOS memory cell including a source region, a drain region and a gate contact, wherein the integrated circuit substrate defines a trench between the source and drain regions, wherein the gate contact is provided in the trench and wherein a floor of the trench extends further into the integrated circuit substrate than lower surfaces of the source and drain regions;
    a first charge trapping pattern on the integrated circuit substrate between a first sidewall of the trench and the source region, the first charge trapping pattern extending on the integrated circuit substrate without extending on the source region or the sidewall of the trench; and
    a second charge trapping pattern on the integrated circuit substrate between a second sidewall of the trench and the drain region, the second charge trapping pattern extending on the integrated circuit substrate without extending on the drain region or the sidewall of the trench.

2. The unit cell of claim 1, further comprising:
    a first dielectric pattern on the integrated circuit substrate between the integrated circuit substrate and the first charge trapping pattern;
    a second dielectric pattern on the first charge trapping pattern;
    a third dielectric pattern on the integrated circuit substrate between the integrated circuit substrate and the second charge trapping pattern; and
    a fourth dielectric pattern on the second charge trapping pattern.

3. The unit cell of claim 2, wherein the first and third dielectric patterns have thicknesses of from about 25 to about 35 Å and wherein the second and fourth dielectric patterns have thicknesses of from about 30 to about 50 Å.

4. The unit cell of claim 2, further comprising a gate oxide film on the first and second sidewalls and the floor of the trench between the integrated circuit substrate and the gate contact.

5. The unit cell of claim 4, wherein the gate oxide film further extends onto sidewalls of the first through fourth dielectric patterns and the first and second charge trapping patterns.

6. The unit cell of claim 4, wherein the gate oxide film has a thickness of from about 50 to about 80 Å.

7. The unit cell of claim 2, wherein the first through fourth dielectric patterns and the first and second charge trapping patterns have similar widths.

8. The unit cell of claim 1, wherein the trench extends at least about 2000 Å into the integrated circuit substrate.

9. The unit cell of claim 2, wherein the first and third dielectric patterns extend directly on the integrated circuit substrate without extending on the source/drain or on the sidewall of the trench.

* * * * *